United States Patent
Li et al.

(10) Patent No.: US 7,743,309 B2
(45) Date of Patent: Jun. 22, 2010

(54) DISTRIBUTED SOURCE CODING WITH CONTEXT

(75) Inventors: Jin Li, Sammamish, WA (US); Yong Sun, Hoffman Estates, IL (US)

(73) Assignee: Microsoft Corporation, Redmond, WA (US)

( * ) Notice: Subject to any disclaimer, the term of this patent is extended or adjusted under 35 U.S.C. 154(b) by 1132 days.

(21) Appl. No.: 11/384,062

(22) Filed: Mar. 17, 2006

(65) Prior Publication Data
US 2007/0216545 A1 Sep. 20, 2007

(51) Int. Cl.
*H03M 13/00* (2006.01)
(52) U.S. Cl. .................... 714/774; 714/785
(58) Field of Classification Search ............. 714/774, 714/785
See application file for complete search history.

(56) References Cited

U.S. PATENT DOCUMENTS

| | | | | |
|---|---|---|---|---|
| 4,477,903 A | * | 10/1984 | Immink et al. | 714/755 |
| 4,675,870 A | * | 6/1987 | Baggen | 714/780 |
| 5,023,869 A | * | 6/1991 | Grover et al. | 370/421 |
| 5,381,422 A | * | 1/1995 | Shimizu | 714/755 |
| 5,390,195 A | * | 2/1995 | Brush | 714/778 |
| 5,506,687 A | * | 4/1996 | Gillard et al. | 386/21 |
| 5,740,187 A | * | 4/1998 | Tanaka | 714/755 |
| 5,757,824 A | * | 5/1998 | Arai et al. | 714/755 |
| 5,812,603 A | * | 9/1998 | Luthi et al. | 375/287 |
| 5,841,794 A | * | 11/1998 | Inoue et al. | 714/755 |
| 6,233,708 B1 | * | 5/2001 | Hindelang et al. | 714/747 |
| 6,681,365 B1 | * | 1/2004 | Anand et al. | 714/790 |

OTHER PUBLICATIONS

Aaron, A., and B. Girod, Compression with side information using turbo codes, *IEEE Int'l Conf. on Data Compression*, Snowbird, UT, Apr. 2002, pp. 252-261.
Berrou C., and A. Glavieux, Near optimum error correcting coding and decoding: turbo-codes, *IEEE Trans. Comm.*, vol. 44, pp. 1261-1271, Jul. 1973.
Li, J., Z. Tu, and R. S. Blum, Slepian-Wolf coding for nonuniform sources using turbo codes, *Proc. DCC '04*, Snowbird, UT, Mar. 2004.
Liveris, A., Z. Xiong, and C. Georghiades, Compression of binary source with side information at the decoder using LDPC codes, *IEEE Comm. Letters*, vol. 6, pp. 440-442, Oct. 2002.
Pradham, S., J. Kusuma, and K. Ramachandran, Distributed compression in a dense microsensor network, *IEEE Signal Processing Magazine*, vol. 19, pp. 51-60, Mar. 2002.
Rissanen, J., A universal data compression system, *IEEE Trans. Info. Theory*, vol. IT-29, pp. 656-664, Sep. 1983.
Slepian, D., and J. K. Wolf, Noiseless coding of correlated information sources, *IEEE Trans. Info. Theory*, vol. 19, pp. 471-480, Jul. 1973.
Xiong, Z., A. Liveris, and S. Cheng, Distributed source coding for sensor networks, *IEEE Signal Processing Magazine*, vol. 21, pp. 80-94, Sep. 2004.

* cited by examiner

*Primary Examiner*—M. Mujtaba K Chaudry
(74) *Attorney, Agent, or Firm*—Lyon & Harr, LLP; Richard T. Lyon

(57) ABSTRACT

A process for distributed source coding (DSC) using context is presented. By forming contexts from prior coded bitplanes of both a reference and DSC coded peer, the DSC virtual channel is split into several virtual sub-channels of different characteristics. The selection of the sub-channel becomes side information that is known to the receiver. As a result, the DSC coding bitrate is reduced.

15 Claims, 12 Drawing Sheets

| 300 | 0 | 1 | 2 | 3 | 4 | 5 |
|---|---|---|---|---|---|---|
| Sign | + | − | + | − | − | + |
| BP3 | 1 | 0 | 0 | 0 | 0 | 0 |
| BP2 | 0 | 1 | 0 | 1 | 0 | 0 |
| BP1 | 1 | 0 | 1 | 1 | 0 | 1 |
| BP0 | 0 | 1 | 0 | 1 | 0 | 1 |

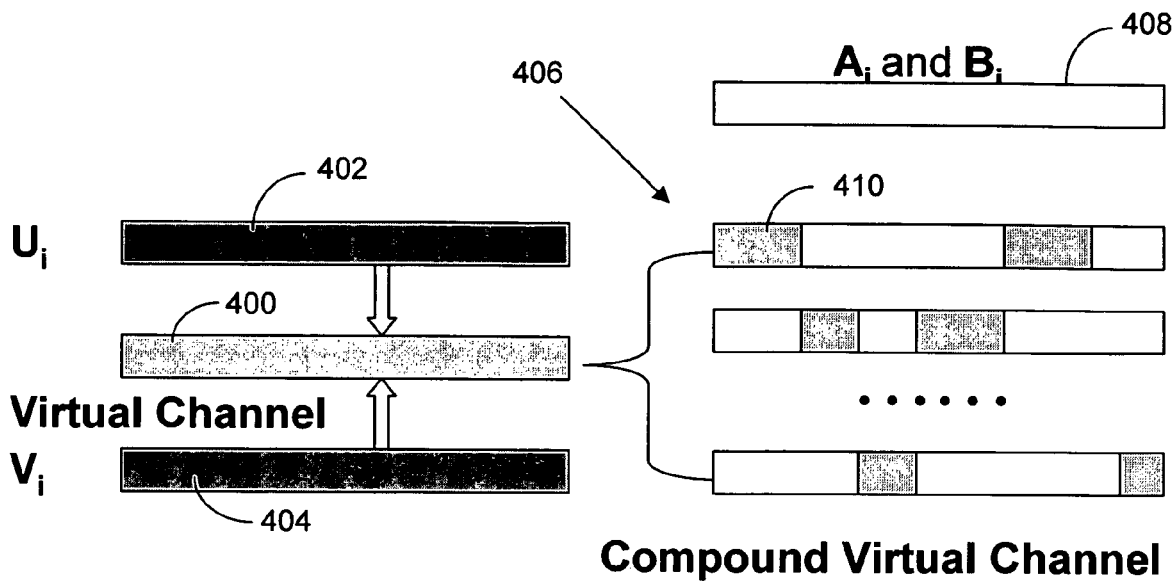

FIG. 4

Table 1

| Bit context | definition | Statistics collected |
|---|---|---|
| sig,sig | $A_{i,j}=0, B_{i,j}=0$ | $p(V_{i,j}|U_{i,j},A_{i,j}=0,B_{i,j}=0), p(A_{i,j}=0,B_{i,j}=0)$ |
| sig, ref | $A_{i,j}=0, B_{i,j}\neq 0$ | $p(V_{i,j}|U_{i,j},A_{i,j}=0,B_{i,j}\neq 0), p(A_{i,j}=0,B_{i,j}\neq 0)$ |
| ref,sig | $A_{i,j}\neq 0, B_{i,j}=0$ | $p(V_{i,j}|U_{i,j},A_{i,j}\neq 0,B_{i,j}=0), p(A_{i,j}\neq 0,B_{i,j}=0)$ |
| ref,ref | $A_{i,j}\neq 0, B_{i,j}\neq 0$ | $p(V_{i,j}|U_{i,j},A_{i,j}\neq 0,B_{i,j}\neq 0), p(A_{i,j}\neq 0,B_{i,j}\neq 0)$ |

FIG. 5

Table 2

| Sign ctx | definition | Statistics collected |
|---|---|---|
| Sig | $A_{i,j}=0, B_{i,j}\neq 0$ | $p(V_{i,j}|U_{i,j},A_{i,j}=0,B_{i,j}\neq 0), p(A_{i,j}=0,B_{i,j}\neq 0)$ |
| Ref | $A_{i,j}\neq 0, B_{i,j}\neq 0$ | $p(V_{i,j}|U_{i,j},A_{i,j}\neq 0,B_{i,j}\neq 0), p(A_{i,j}\neq 0,B_{i,j}\neq 0)$ |

FIG. 6

Table 3

| Bit context | definition | Statistics collected |
|---|---|---|
| Equal | $A_{i,j}=B_{i,j}$ | $p(V_{i,j}/U_{i,j},A_{i,j}=B_{i,j}),p(A_{i,j}=B_{i,j})$ |
| Sig | $A_{i,j}\neq B_{i,j},B_{i,j}=0$ | $p(V_{i,j}/U_{i,j},A_{i,j}\neq B_{i,j},B_{i,j}=0),p(A_{i,j}\neq B_{i,j},B_{i,j}=0)$ |
| Ref | $A_{i,j}\neq B_{i,j},B_{i,j}\neq 0$ | $p(V_{i,j}/U_{i,j},A_{i,j}\neq B_{i,j},B_{i,j}\neq 0),p(A_{i,j}\neq B_{i,j},B_{i,j}\neq 0)$ |

FIG. 7

Table 4

| Sign ctx | definition | Statistics collected |
|---|---|---|
| Sig | $A_{i,j}=0, B_{i,j}\neq 0$ | $p(V_{i,j}|U_{i,j},A_{i,j}=0,B_{i,j}\neq 0),p(A_{i,j}=0,B_{i,j}\neq 0)$ |
| Ref | $A_{i,j}\neq 0, B_{i,j}\neq 0$ | $p(V_{i,j}|U_{i,j},A_{i,j}\neq 0,B_{i,j}\neq 0),p(A_{i,j}\neq 0,B_{i,j}\neq 0)$ |

FIG. 8

Table 5

| Channel error rate | Turbo Loss=$R_2-H(V|U)$ | LDPC Loss=$R_2-H(V|U)$ |
|---|---|---|
| 1/8 | 0.036 | 0.034 |
| 1/4 | 0.060 | 0.038 |
| 1/2 | 0.145 | 0.037 |

$q1 \neq q2; p \to 1$

Table 6

| | No context coding | Context coding | Gain by context coding |
|---|---|---|---|
| Separate source coding | 7.79 | 6.38 | 18.10% |
| Distributed source coding | 6.24 | 4.83 | 22.60% |
| DSC saving | 19.90% | 24.29% | Overall=38% |

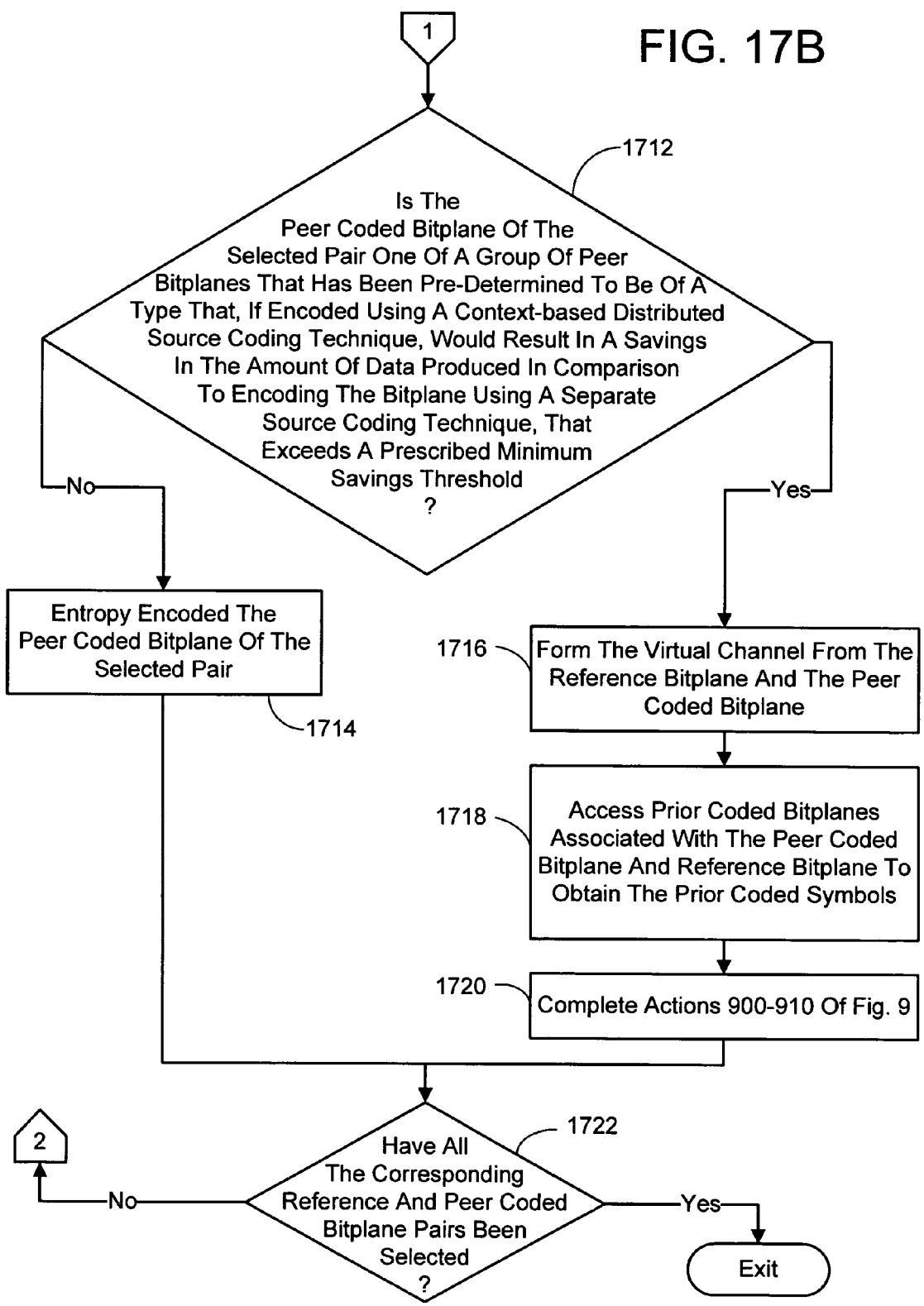

DISTRIBUTED SOURCE CODING WITH CONTEXT

BACKGROUND

Distributed source coding (DSC) enables efficient compression of the outputs of two or more physically separated sources without the sources communicating with each other. DSC has become an active research area because it enables efficient information compression for a number of emerging applications, such as CEO (central estimation officer) problems in a sensor network, the peer-to-peer (P2P) streaming of analog TV/radio, and so on.

The information theory foundation of DSC is the Slepian-Wolf Theory, which states that the lossless compression of two separated sources can be made as efficient as if they are compressed together, as long as joint decoding is done at the receiver. As a result, DSC is often referred as Slepian-Wolf coding (SWC). Although the theory behind DSC has been well understood for over 30 years, practical DSC implementation is far from simple. The implementation of DSC is closely tied to channel coding. A reference and a coded symbol of DSC can be considered as the input and the output of a virtual channel, and the DSC design revolves around the design of a proper channel code that is capable of correcting errors of the virtual channel. As a result, direct DSC coding on multi-level symbols can be converted to the problem of designing an efficient channel code that may handle multi-level channel errors. However, such a channel code has not been well studied in the past, and practical implementation of these codes often results in performance far inferior to a channel code designed for the well-understood binary symmetric channel (BSC), e.g., turbo codes and Low Density Priority Checkcode (LDPC) codes. A popular DSC implementation for multi-level symbols is based on bitplane coding. In such a scheme, coefficients of the reference and the coded peer are first separated into bitplanes. Then, DSC is applied to each bitplane separately. The approach converts a multi-level DSC into multiple binary DSCs.

Although simple and straightforward, the practical implementation of bitplane-based DSC does not demonstrate superior compression performance compared to separately entropy encoding the two sources. This is believed to be due to a number of factors. First, bitplane source coding usually uses advanced statistical technology such as context modeling, which takes advantage of the correlation between the bits. No existing DSC has used context modeling or has effectively explored the correlation between the bits. Second, existing channel codes designed for BSC have a number of limitations, for example, they usually target the BSC channel, have only a limited number of code profiles and may have to use a higher code rate for a certain effective channel error rate in DSC. Moreover, the performance gap between what can be achieved by a practical channel coder and the theoretical bound is larger than the performance gap between what can be achieved by a practical source coder and its theoretical bound.

SUMMARY

A process for distributed source coding (DSC) using context is presented. By forming contexts from prior coded bitplanes of both a reference and DSC coded peer, the DSC virtual channel is split into several virtual sub-channels of different characteristics. The selection of the sub-channel becomes side information that is known to the receiver. As a result, the DSC coding bitrate is reduced.

More particularly, the encoding part of the process is implemented in one embodiment by establishing the DSC virtual channel between a set of to-be coded symbols and a set of reference symbols. The to-be coded symbols can represent a bitplane of to-be coded bits, and the set of reference symbols can represent a corresponding bitplane of reference bits, although this is not necessary. A prescribed number of context categories are established for the virtual channel using a set of prior coded symbols. In one embodiment, these prior coded symbols represented bitplanes of prior coded bits, although again this is not required if the to-be coded symbols and reference symbols are not bitplanes. Once the context categories have been established, the virtual channel is divided into multiple sub-channels, each dedicated to one of the context categories. A channel error characteristic is then calculated for each sub-channel and a combined channel error rate of the virtual channel as a whole is computed. The set of to-be coded symbols is then channel encoded into syndrome or parity bits using a channel encoder which are capable of protecting against the computed combined channel error rate.

Given the foregoing, the decoding part of the process is implemented in one embodiment by first inputting the set of reference symbols and a set of prior coded symbols. These symbols are available from the normal decoding of the reference and from the DSC decoding of earlier parts of the peer. As indicated previously, these symbols can represent bitplanes if that is what was encoded. In such a case, the prior coded symbols are previously decoded reference and peer bitplanes. The decoding part of the process continues by establishing context categories for the virtual channel. These context categories are based on the context categories used to divide the virtual channel into sub-channels during encoding, but may be more detailed. The virtual channel is then divided into multiple sub-channels, each of which is dedicated to one of the context categories. A channel error characteristic is calculated for each sub-channel, and then a log likelihood of each coded symbol is computed using the reference symbols and the corresponding virtual sub-channel error characteristic. Finally, the coded symbols are decoded using a channel decoder to remove the errors of the virtual channel.

It is noted that while the foregoing limitations in existing DSC schemes described in the Background section can be resolved by a particular implementation of a context-based DSC process according to the present invention, this process is in no way limited to implementations that just solve any or all of the noted disadvantages. Rather, the present process has a much wider application as will become evident from the descriptions to follow.

It should also be noted that this Summary is provided to introduce a selection of concepts, in a simplified form, that are further described below in the Detailed Description. This Summary is not intended to identify key features or essential features of the claimed subject matter, nor is it intended to be used as an aid in determining the scope of the claimed subject matter. In addition to the just described benefits, other advantages of the present invention will become apparent from the detailed description which follows hereinafter when taken in conjunction with the drawing figures which accompany it.

DESCRIPTION OF THE DRAWINGS

The specific features, aspects, and advantages of the present invention will become better understood with regard to the following description, appended claims, and accompanying drawings where:

FIG. 4 is a diagram illustrating the use of context in DSC to form a compound virtual channel made up of multiple sub-channels of the virtual channel.

FIG. 5 is a table showing the definitions and the statistics collected for a first context scheme used to encode and decode non-sign bit bitplanes in the context-based DSC process.

FIG. 6 is a table showing the definitions and the statistics collected for the first context scheme used to encode and decode the sign bit bitplane in the context-based DSC process.

FIG. 7 is a table showing the definitions and the statistics collected for a second context scheme used to encode and decode non-sign bit bitplanes in the context-based DSC process.

FIG. 8 is a table showing the definitions and the statistics collected for the second context scheme used to encode and decode the sign bit bitplane in the context-based DSC process.

FIGS. 17A-B are a continuing flow chart diagramming a generalized process to for encoding two, correlated input signals on a bitplane-by-bitplane basis where separate source coding is used for those bitplanes where the DSC savings is too low to justify the extra processing required.

DETAILED DESCRIPTION

In the following description of embodiments of the present invention reference is made to the accompanying drawings which form a part hereof, and in which are shown, by way of illustration, specific embodiments in which the invention may be practiced. It is understood that other embodiments may be utilized and structural changes may be made without departing from the scope of the present invention.

1.0 The Computing Environment

Before providing a description of embodiments of the present context-based DSC process, a brief, general description of a suitable computing environment in which portions of the process may be implemented will be described. The process is operational with numerous general purpose or special purpose computing system environments or configurations. Examples of well known computing systems, environments, and/or configurations that may be suitable for use with the process include, but are not limited to, personal computers, server computers, hand-held or laptop devices, multiprocessor systems, microprocessor-based systems, set top boxes, programmable consumer electronics, network PCs, mini-computers, mainframe computers, distributed computing environments that include any of the above systems or devices, and the like.

Figures 1, 3:
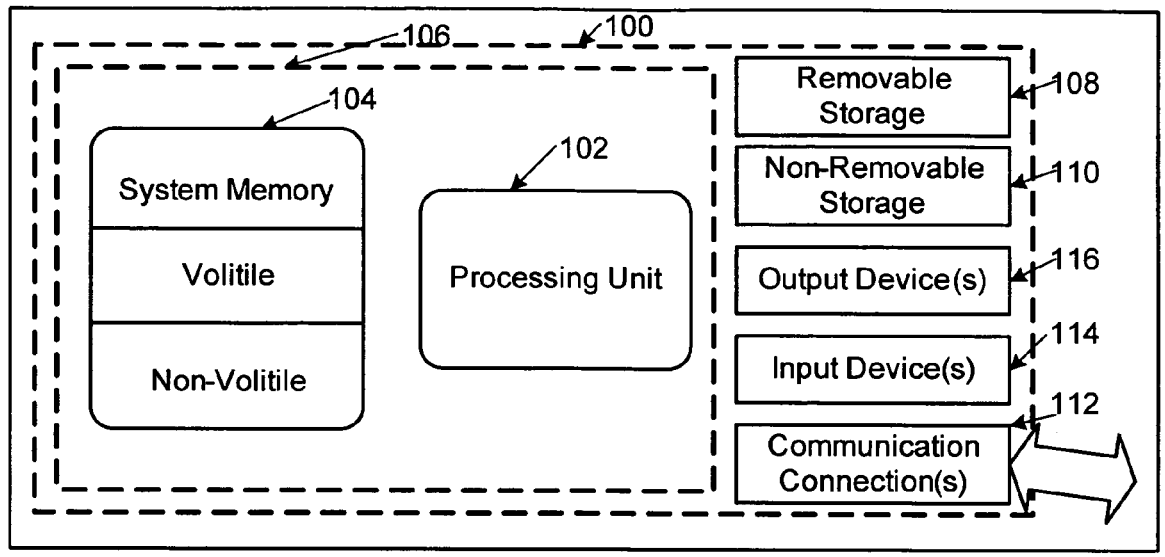
FIG. 1 is a diagram depicting a general purpose computing device constituting an exemplary system for implementing the present process.
FIG. 3 is an exemplary grid illustrating context in a bitplane source coding scheme where the sign bits associated with the coefficients (0-5 in this example) are in the topmost row and the rest of the bitplanes (BP3-BP0) follow in order in the rows below. All bits in the significant identification context category are shown in shaded boxes, and the bits in the refinement context category are shown in non-shaded boxes.

FIG. 1 illustrates an example of a suitable computing system environment. The computing system environment is only one example of a suitable computing environment and is not intended to suggest any limitation as to the scope of use or functionality of the present process. Neither should the computing environment be interpreted as having any dependency or requirement relating to any one or combination of components illustrated in the exemplary operating environment. With reference to FIG. 1, an exemplary system for implementing the present process includes a computing device, such as computing device 100. In its most basic configuration, computing device 100 typically includes at least one processing unit 102 and memory 104. Depending on the exact configuration and type of computing device, memory 104 may be volatile (such as RAM), non-volatile (such as ROM, flash memory, etc.) or some combination of the two. This most basic configuration is illustrated in FIG. 1 by dashed line 106. Additionally, device 100 may also have additional features/functionality. For example, device 100 may also include additional storage (removable and/or non-removable) including, but not limited to, magnetic or optical disks or tape. Such additional storage is illustrated in FIG. 1 by removable storage 108 and non-removable storage 110. Computer storage media includes volatile and nonvolatile, removable and non-removable media implemented in any method or technology for storage of information such as computer readable instructions, data structures, program modules or other data. Memory 104, removable storage 108 and non-removable storage 110 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can accessed by device 100. Any such computer storage media may be part of device 100.

Device 100 may also contain communications connection(s) 112 that allow the device to communicate with other devices. Communications connection(s) 112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 100 may also have input device(s) 114 such as keyboard, mouse, pen, voice input device, touch input device, etc. Output device(s) 116 such as a display, speakers, printer, etc. may also be included. All these devices are well know in the art and need not be discussed at length here.

The present process may be described in the general context of computer-executable instructions, such as program modules, being executed by a computing device. Generally, program modules include routines, programs, objects, components, data structures, etc. that perform particular tasks or implement particular abstract data types. The process may also be practiced in distributed computing environments where tasks are performed by remote processing devices that are linked through a communications network. In a distributed computing environment, program modules may be located in both local and remote computer storage media including memory storage devices.

The exemplary operating environment having now been discussed, the remaining parts of this description section will be devoted to a description of the program modules embodying the process.

2.0 Distributed Source Coding: Framework

Figure 2:
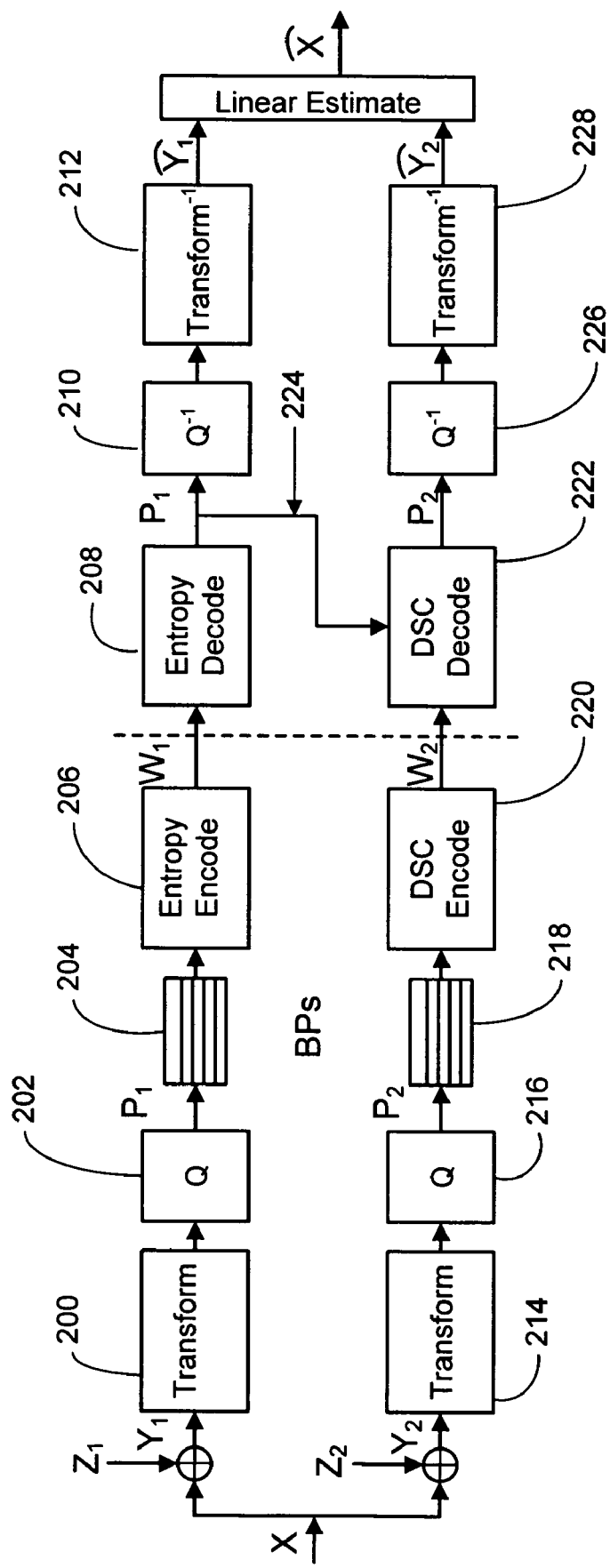
FIG. 2 is a diagram depicting a framework for distributed source coding (DSC).

The DSC framework is shown in FIG. 2. The upper path of the framework is a traditional source coder. The input signal $Y_1$ is first transformed 200 and quantized 202 to coefficients $P_1$. The quantized coefficients are then split 204 into bitplanes, and entropy encoded 206 from the most significant bitplanes (MSB) to the least significant bitplanes (LSB). At the receiver, the compressed bitstreams are entropy decoded 208. Because the entropy encoder and decoder modules are lossless, if all bitplanes are decoded, the recovered quantized coefficients will be exactly the same as $P_1$. Finally, the decoded coefficients are inverse quantized 210 and inverse transformed 212 to reconstruct the source $\hat{Y}_1$.

The lower path of the framework is the DSC path. The input signal of the lower path $Y_2$ is transformed 214 and quantized 216 into coefficients $P_2$ via exactly the same transform and quantization module of the upper path. The coefficients are split 218 into bitplanes, and DSC encoded 220 from MSB to LSB. At the decoder, the bitplane is DSC decoded 222 with the corresponding bitplane of the upper path as side information 224. Finally, the DSC decoded bitplanes are reassembled into the quantized coefficients $P_2$, inversely quantized 226 and inversely transformed 228 to recover the transform coefficients $\hat{Y}_2$.

In FIG. 2, both the entropy coding and the DSC coding proceeds from MSB to LSB. Moreover, coding of the less significant bitplanes only requires information of the more significant bitplanes. As a result, present DSC process is scalable. The bitstreams of both paths can be truncated for decoding of signals at lesser quality level.

In the above framework, both signals $Y_1$ and $Y_2$ can be observed from separate sensors. It is called direct DSC coding. Alternately, as shown in FIG. 2, both signals can come from a common signal source X. In that case, $Y_1$ and $Y_2$ can be considered the noisy observation of the source. This problem is called indirect DSC coding, and the source X is not observed directly. After decoding of the encoded input signals, the source may be estimated via a linear estimator as:

$$\hat{X} = \alpha_1 \hat{Y}_1 + \alpha_2 \hat{Y}_2, \quad \text{where} \tag{1}$$

$$\alpha_1 = \alpha_2 = \frac{E[X^2]}{2E[X^2] + (\sigma_z^2 + D)}. \tag{2}$$

In Eq. (2), $E[X^2]$ is the energy of the source, $\sigma_z^2$ is the observation noise variance, and D is the coding distortion of the signal $Y_1$ and $Y_2$. The observation error of the source X can be calculated as:

$$E\left[\left(X - \hat{X}\right)^2\right] = \frac{E[X^2](\sigma_z^2 + D)}{2E[X^2] + (\sigma_z^2 + D)}. \tag{3}$$

3.0. Distributed Source Coding With Context

Context modeling is a widely used technology in modern source coding. It has been extensively studied for statistical model-based arithmetic coding. JPEG 2000, a modern image compressor, utilizes context modeling in its bitplane coding engine to improve the compression efficiency. Context is generally defined as a category value assigned to a certain symbol (bit) based on prior coded symbols (bits). In JPEG 2000, the bits in a bitplane are classified into three big categories based on the context: significant identification, refinement and sign. Sign is just + and − of the coefficient. For a certain bit of a certain coefficient, if all the bits in the more significant bitplanes are all 0s, the bit belongs to the significant identification category. Otherwise, it belongs to the refinement category. An example is shown in FIG. 3. The sign bits 300 are in the topmost row. All bits 302 in the significant identification category are shown in shaded boxes, and the refinement bits 304 are shown in non-shaded boxes. Context modeling can improve compression efficiency because bits belonging to different contexts are highly different in entropy statistics and coding distortion statistics. By separating bits into different contexts, a modern source coder may apply statistical modeling separately, and apply suitable entropy coding parameters to each separate group.

In the present process, context modeling is extended to DSC. Because there are two signals in DSC, the DSC context involves the bitplanes derived from both. Let the current coded bitplane be the i th bitplane, let the reference coded bitplane be $U_i$, and the DSC coded bitplane be $V_i$, where the term coded bitplane refers to a bitplane derived from the transformed and quantized coefficients of an input signal. The j index is used to index the coefficient, therefore, the i th bit of j th coefficient at the reference and peer is $U_{ij}$ and $V_{ij}$, respectively. All more significant coded bitplanes of the reference form the reference prior coded bitplane data:

$$A_i = \{U_{m-1}, \ldots, U_{i+1}\}, \tag{4}$$

and all the more significant coded bitplanes of the peer form the peer prior coded bitplane data:

$$B_i = \{V_{M-1}, \ldots, V_{i+1}\}. \tag{5}$$

With context modeling, in DSC the virtual channel 400, which is the virtual channel formed by transmitting signal $V_i$ 404 to $U_i$ 402, becomes a compound virtual channel 406, as shown in FIG. 4. Depending on the values of $A_i$ and $B_i$ 408, a sub-channel 410 is selected among the compound virtual channel 406. Different sub-channels 410 may exhibit different channel error characteristics.

Note that context modeling in DSC differs from that of source coding. First, obtaining statistics of each sub-channel is trickier. In context source coding, statistics of the already coded symbol in a context is directly used as the statistics of the symbol for future coding. This could be used similarly in DSC. However, because the correlation between the reference and coded bitplanes in DSC may change dramatically across different bitplanes, it may not be as effective. An alternative approach assumes knowledge of the correlation of the reference and coded signal $Y_1$ and $Y_2$. A Monte-Carlo simulation can then be used to calculate the statistics of each context of each bitplane. In tested embodiments, two context schemes were employed. The first of these uses four contexts for non-sign bitplane coding and two contexts for sign coding (as signs are only coded when a coefficient becomes non-zero). The definition and the statistics collected for each context in this first scheme are shown in Table 1 (see FIG. 5) and Table 2 (see FIG. 6). The second context scheme uses three contexts for non-sign bitplane coding and two contexts for sign coding. The definition and the statistics collected for each context in this second scheme are shown in Table 3 (see FIG. 7) and Table 4 (see FIG. 8). Note that the two contexts for sign coding is exactly the same as the first scheme. While the foregoing two context schemes were employed in the tested embodiments, other schemes could be used as well without departing from the scope of the present process.

In DSC, the context component that uses reference prior coded bitplane data $A_i$ are only available to the receiver, and are not available to the sender. As a result, the context DSC encoder uses collective information of the compound channel. More specifically, for the DSC encoder, only the channel error rate $R_i$ at bitplane i is needed. In the case of the first example context scheme described above:

$$R_i = H(V_{i,j} | U_{i,j}, A_{i,j}, B_{i,j}) \quad (6)$$
$$= H(V_{i,j} | U_{i,j}, A_{i,j} = 0, B_{i,j} = 0) \cdot p(A_{i,j} = 0, B_{i,j} = 0) +$$
$$H(V_{i,j} | U_{i,j}, A_{i,j} \neq 0, B_{i,j} = 0) \cdot p(A_{i,j} \neq 0, B_{i,j} = 0) +$$
$$H(V_{i,j} | U_{i,j}, A_{i,j} = 0, B_{i,j} \neq 0) \cdot p(A_{i,j} = 0, B_{i,j} \neq 0) +$$
$$H(V_{i,j} | U_{i,j}, A_{i,j} \neq 0, B_{i,j} \neq 0) \cdot p(A_{i,j} \neq 0, B_{i,j} \neq 0).$$

In the case of the second example context scheme described above:

$$R_i = H(V_{i,j} | U_{i,j}, A_{i,j}, B_{i,j}) \quad (7)$$
$$= H(V_{i,j} | U_{i,j}, A_{i,j} = B_{i,j}) \cdot p(A_{i,j} = B_{i,j}) +$$
$$H(V_{i,j} | U_{i,j}, A_{i,j} \neq B_{i,j} = 0) \cdot p(A_{i,j} \neq B_{i,j}, B_{i,j} = 0) +$$
$$H(V_{i,j} | U_{i,j}, A_{i,j} \neq B_{i,j}, B_{i,j} \neq 0) \cdot p(A_{i,j} \neq B_{i,j}, B_{i,j} \neq 0).$$

Similar equations would be employed for other context schemes.

The DSC encoder selects a proper channel code (e.g., turbo or LDPC) and channel code rate (H). The exact context of each bit is provided only to the DSC decoder, which will use the context information and the statistics of each context to set the a priori log likelihood (LLR) of each bit for a turbo or LDPC channel decoder. In short, the LLR of coefficient j at bitplane i is set to:

$$LLR(i, j) = \log\left[\frac{p(V_{i,j} = 0 | U_{i,j}, A_{i,j}, B_{i,j})}{p(V_{i,j} = 1 | U_{i,j}, A_{i,j}, B_{i,j})}\right] \quad (8)$$

Then turbo or LDPC channel decoding can be performed via well-known channel decoding schemes, such as Belief propagation.

In regard to the encoder calculating the channel code rate (H) in the present context-based DSC encoding scheme, and the decoder's use of the exact context of each bit, these concepts can be best explained with an example. It should be noted that the following is just a simplified example and is not intended to limit the scope of the present process in any way.

The encoder has available to it: $V_i$, $B_i$, the virtual channel and the channel error rate $R_i$. However, the encoder does not have access to $U_i$ or $A_i$. As a result, it cannot divide the virtual channel into the full range of context categories before channel coding the data. Only the decoder has the full knowledge. For example, assume there are one prior coded bit in the peer (PP) and the reference (PR), and the above-described first context category scheme is employed. Potentially, there are 4 contexts, and so 4 sub-channels:

PP=0, PR=0;

PP=0, PR=1;

PP=1, PR=0; and

PP=1, PR=1.

Now assume each prior coded bit appears with 50% probability, and the channel error rate (e) and resulting coding rate (H) is as follows:

PP=0, PR=0, e=0.001, H=0.011;

PP=0, PR=1, e=0.01, H=0.08;

PP=1, PR=0, e=0.01, H=0.08; and

PP=1, PR=1, e=0.1, H=0.47.

For the channel encoder, it can only access the PP bit, therefore, it can form two sub-channels with required coding rates as follows:

PP=0, H=0.046; and

PP=1, H=0.275.

Thus, the encoder can separate the peer bits based on PP=0 and PP=1 into two streams, and apply a two channel error encoder with rates 0.046 and 0.275, respectively.

For the channel decoder, since it can access both the PP and PR bits, it can "see" four virtual channels. The decoder employs this full information for decoding using all four context categories. It should be noted that the channel decoder could ignore the PR bit and decode using the same two context categories as the encoder. But if so, the channel decoder will see a mixed channel of error 0.0055 (H=0.049) and error 0.055 (H=0.307), respectively. This would be higher than that found using the full context available.

3.1 The Encoding And Decoding Process

Figure 9:
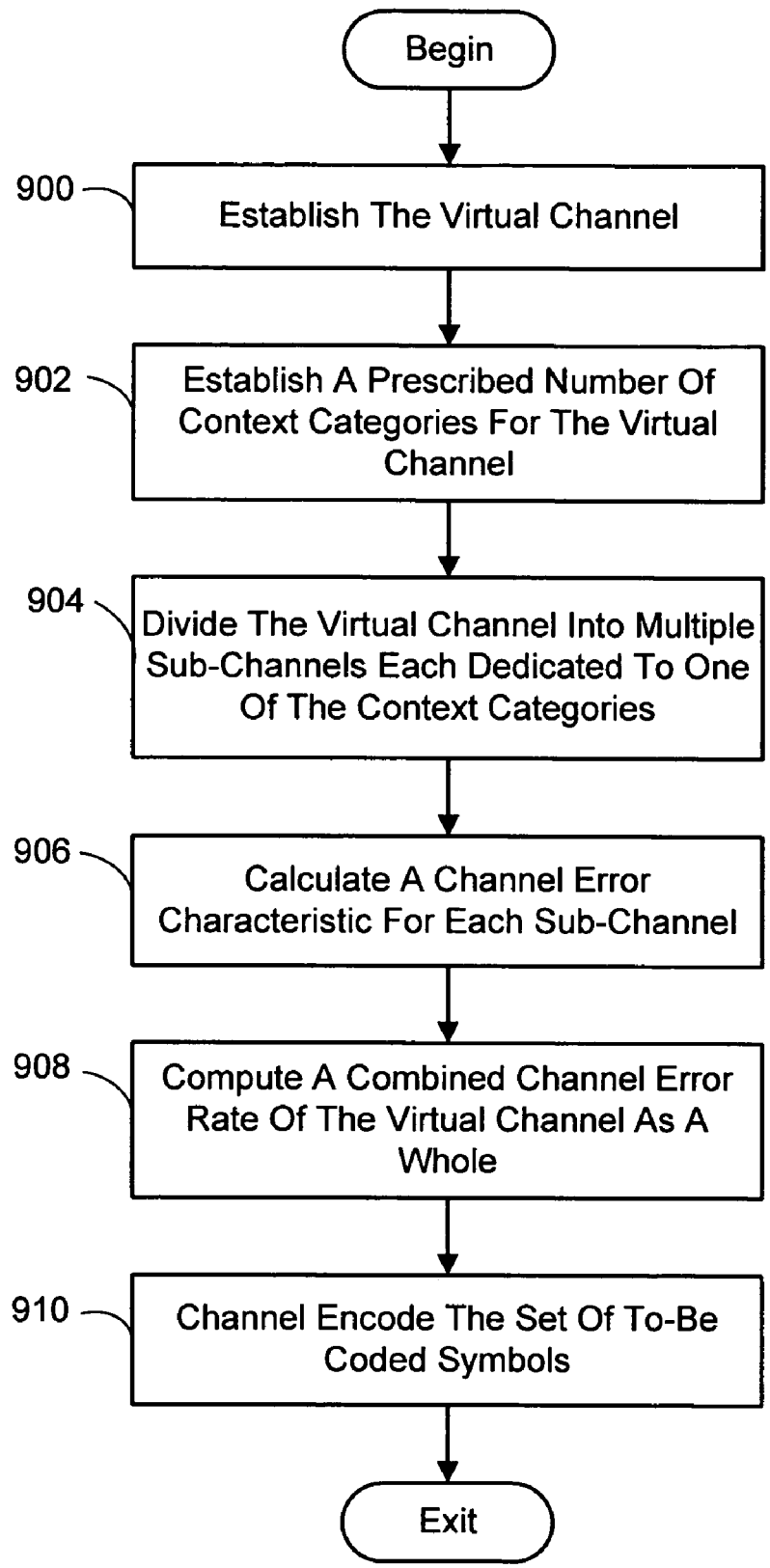
FIG. 9 is a flow chart diagramming one embodiment of a generalized process for context-based DSC encoding.

Given the foregoing, one general embodiment of the present context-based DSC encoding and decoding process can be implemented as follows. The encoding process starts out the same way as standard DSC to the point where a virtual channel is formed. Then, referring to FIG. 9, in process action 900 the virtual channel is established between the set of to-be coded symbols and the set of reference symbols. In one embodiment, the to-be coded symbols are a bitplane of to-be coded bits, and the set of reference symbols is a bitplane of reference bits. Next, a prescribed number of context categories are established for the virtual channel using a set of prior coded symbols (process action 902). These prior coded symbols can be bitplanes of prior coded bits. Once the context categories have been established, the virtual channel is divided into multiple sub-channels each dedicated to one of the context categories (process action 904). A channel error characteristic is then calculated for each sub-channel (process action 906), and a combined channel error rate of the virtual channel as a whole is computed (process action 908). Note that the channel encoder only needs the parameter of the combined channel error rate. Therefore, the above calculation can be done at the sender, or done at the receiver, with the resultant combined channel error rate sent to the sender. The set of to-be coded symbols is then channel encoded into syndrome or parity bits using a channel encoder which are capable of protecting against the computed combined channel error rate (process action 910).

Figure 10:
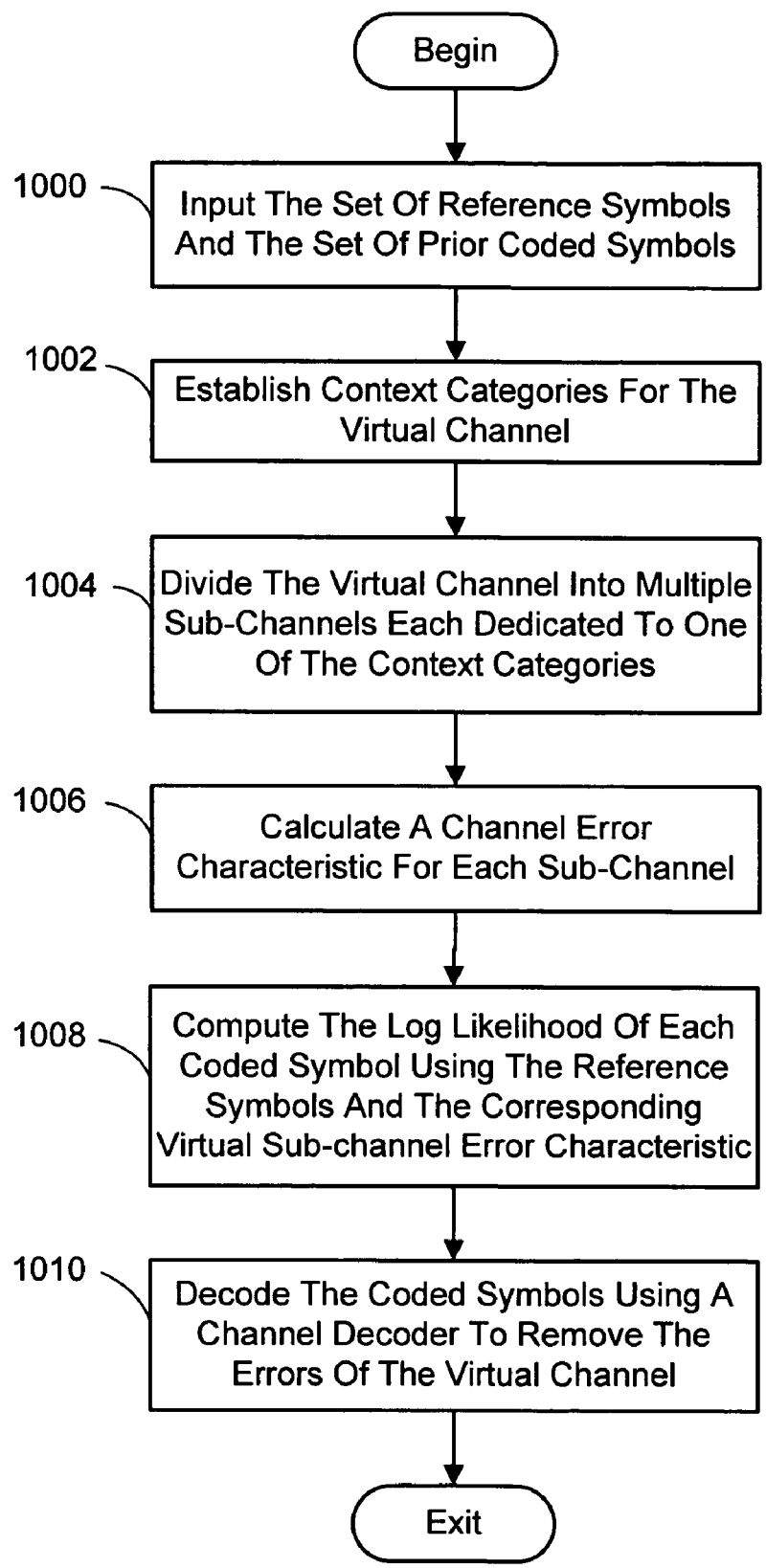
FIG. 10 is a flow chart diagramming one embodiment of a generalized process for context-based DSC decoding.

Referring now to FIG. 10, the decoding process involves first inputting the set of reference symbols and a set of prior coded symbols (process action 1000). These items are available from the normal decoding of the reference signal and from the DSC decoding of earlier parts of the peer signal. In one embodiment, the coded symbols being decoded are a bitplane of coded bits, the reference symbols are a bitplane of reference bits, and the prior coded symbols are previously decoded reference and peer bitplanes. Context categories are established next for the virtual channel (process action 1002). These context categories are based on the context categories used to divide the virtual channel into sub-channels during encoding, but may be more detailed. The virtual channel is then divided into multiple sub-channels each dedicated to one of the context categories (process action 1004), and a channel error characteristic is calculated for each sub-channel (process action 1006). A log likelihood of each coded symbol is computed using the reference symbols and the corresponding virtual sub-channel error characteristic (process 1008). Finally, the coded symbols are decoded using a channel decoder to remove the errors of the virtual channel (process action 1010).

3.2. Turbo vs. LDPC Based Distributed Source Coding

The channel codes usually considered for DSC are the turbo codes and the LDPC codes. Turbo code is usually constructed via the parallel concatenation of two convolutional codes with an interleaver placed in front of one of the convolutional codes. The construction of the turbo code is systematic, and a new turbo code can be readily generated for any input block length.

In comparison, LDPC code is constructed via a graph linking two sets of nodes: the variable nodes (holding the information bits) and the source nodes (holding the parity bits). The two sets are connected through an edge interleaver. A good LDPC code needs an edge interleaver that is free of short cycles (at lease length-2 and length-4 cycles), and the removal of cycles is the primary computation complexity in LDPC code construction and is very expensive. Therefore, LDPC code needs to be pre-designed with regard to input block length. Moreover, when the channel error rate becomes low, the removal of short cycles becomes difficult to perform. It has been found that successful interleavers can only be generated at code rates above about 0.1.

Figures 11, 12, 15:
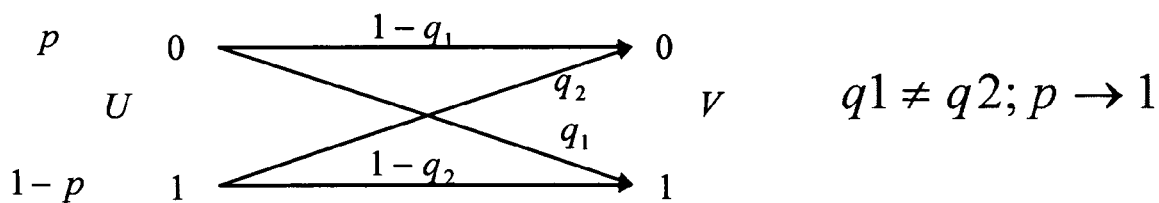
FIG. 11 is a table comparing the binary symmetric channel code performance of turbo codes to that of LDPC codes.
FIG. 12 is a diagram illustrating the binary asymmetric channel.
FIG. 15 is a table comparing separate source coding to DSC, both with and without context coding.

In Table 5 (see FIG. 11), the BSC (binary symmetric channel) channel code performance of turbo code is compared to that of LDPC code. A simulated BSC channel with error rate $R_i$ being 0.125, 0.25 and 0.5 bpp, respectively, was used to construct the table. The channel code rate of the LDPC and turbo code was gradually increased until all errors were corrected. The gap between the channel code rate and the actual channel error rate for turbo and LDPC code were recorded, and included in Table 5. A larger gap indicates poor channel code performance. It was found that LDPC codes always work better than turbo codes. Moreover, the performance gap between the turbo and LDPC grows larger when the channel error rate becomes high.

This favors the use of the LDPC code when possible. However, construction of LDPC code is difficult for channel error rate smaller than 0.1, as the interleaver of the LDPC code will be extremely complex for the algorithm used to remove short cycles to work.

Based on the above observations, one embodiment of the present process uses the LDPC code for those bitplanes where the channel error rate is above about 0.1, and uses the turbo codes for those bitplanes where the channel error rate is below about 0.1.

3.3. Binary Asymmetric Channel

Existing turbo and LDPC codes are designed for a BSC channel, where bit 0 occurs in equal probability to bit 1. However, in bitplane coding, only the refinement bit is equally probable. A bit in the significant identification category is highly skewed towards zero, both for a prior probability of the reference bit U, and for the transfer probability towards the coded bit V. This is evident in FIG. 12, where the probability of reference bit U being 0 is p, and the probability of the coded bits being 0 is $p(1-q_1)+(1-p)(1-q_2)$. It was found that both of them are very close to 1, in fact p is close to 1, $q_1$ is close to 0, and $q_2$ is close to 1. It was also found that the LDPC-based DSC does not suffer in performance with regard to the binary asymmetric channel. However, the performance of the turbo-based DSC suffers significantly.

Figure 13:
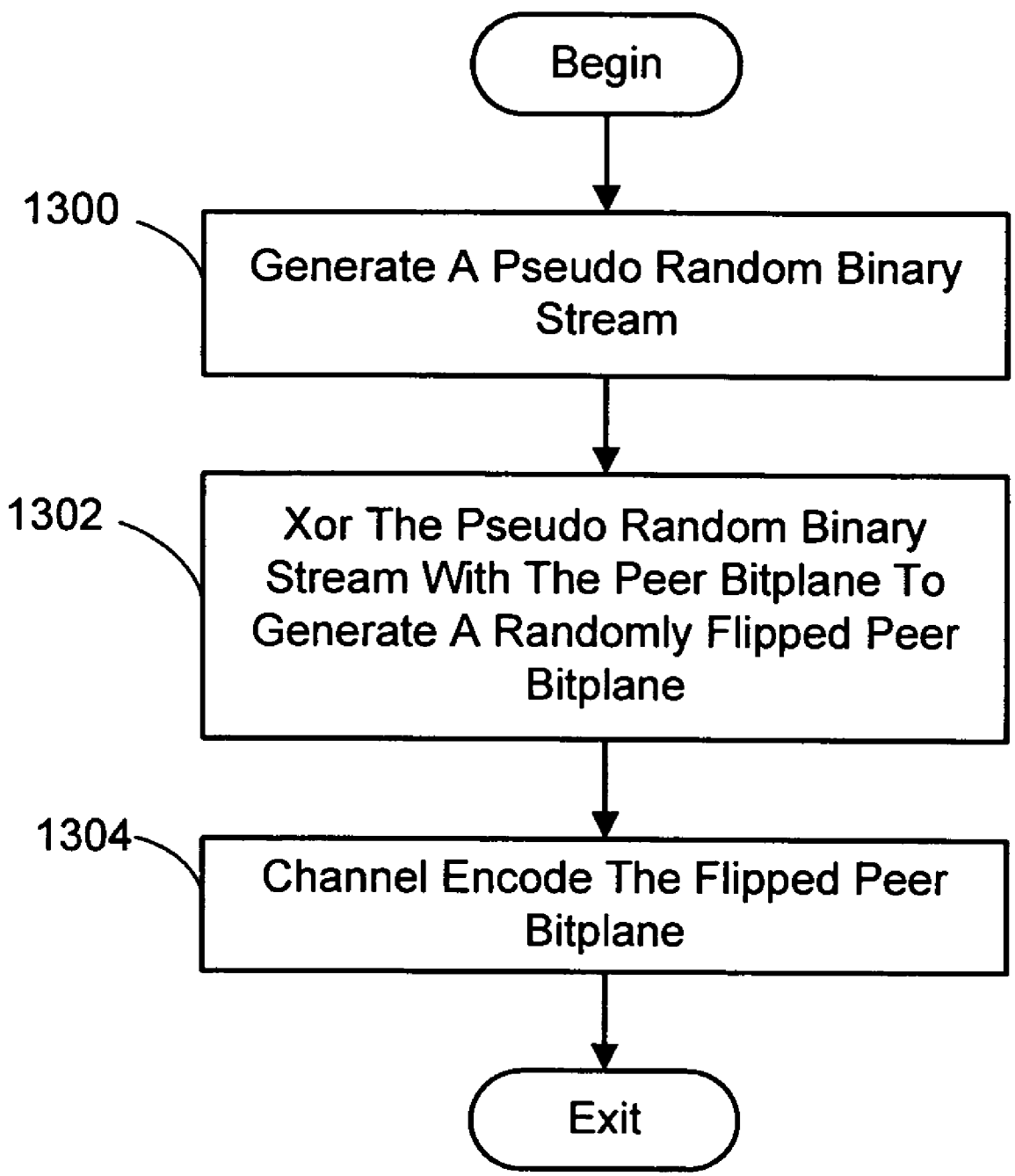
FIG. 13 is a flow chart diagramming one implementation of a random flipping procedure in standard DSC encoding.

One solution is to re-design the turbo code based on the binary asymmetric channel. However, this involves significant work and is not trivial. In one embodiment of the present process, a simple solution is adopted: namely a random flipper is employed to transfer the binary asymmetric channel into a BSC channel. A pseudo random seed is used which is synchronized between the encoder and decoder to generate a pseudo random binary stream. This pseudo random stream is then "xored" onto the $V_i$ before it is DSC encoded. At the time of DSC decoding, the same pseudo random sequence is xored onto the reference bitplane $U_i$ to correct the bias. It was found the use of a random flipper greatly improved the DSC performance of turbo coding, although it could also be used for any channel coding scheme. The random flipper is used for all turbo-based DSC in the example implementation described in the next section It is noted that this unique random flipping procedure can improve the performance of channel coding in DSC even if the present context-based DSC is not implemented. In general, the random flipping procedure can be accomplished as follows for standard DSC encoding and decoding. Referring to FIG. 13, the process begins by generating a pseudo random binary stream (process action 1300). The pseudo random binary stream is then xored with the peer bitplane to generate a randomly flipped peer bitplane (process action 1302). Finally, the flipped peer bitplane is channel encoded (process action 1304).

Figure 14:
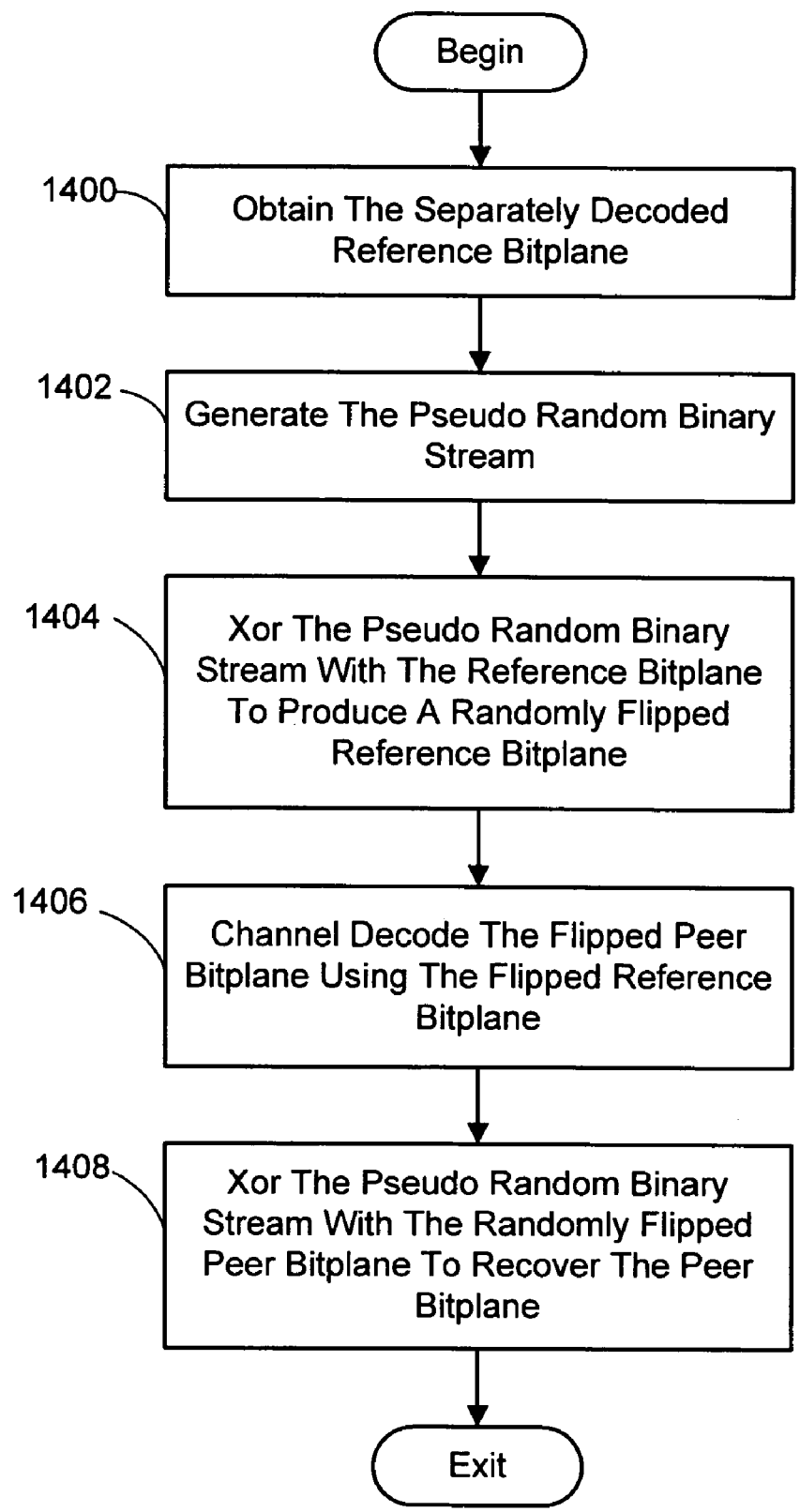
FIG. 14 is a flow chart diagramming one implementation of a random flipping procedure in standard DSC decoding.

Referring now to FIG. 14, the corresponding decoding process involves first obtaining the separately decoded reference bitplane (process action 1400) and generating the pseudo random binary stream (process action 1402). The pseudo random binary stream is then xored with the reference bitplane to produce a randomly flipped reference bitplane (process action 1404). Next, the flipped peer bitplane is channel decoded using the flipped reference bitplane (process action 1406). Finally, the pseudo random binary stream is xored with the randomly flipped peer bitplane to recover the peer bitplane (process action 1408).

The random flipping procedure is implemented in context-based DSC in the same way it is implemented in standard DSC, with the difference that the randomly flipped coded bitplane is employed when computing the log likelihood.

4.0 DSC vs. Separate Source Coding on a Bitplane-By-Bitplane Basis

The following analysis will show that DSC is a better choice for coding some bitplanes, while separate source coding is better for other bitplanes. The present context-based DSC process can be applied to distributed audio coding, among other implementations. A distributive audio coding application will be used as an example implementation in the analysis. The example implementation generally has the setup shown in FIG. 2. The audio source used in the example is obtained from the MPEG sound quality assessment material. It is assumed that the original audio is broadcast by radio, and received by two peers with uncorrelated AWGN noise with a signal-to-noise ratio of 80 dB. Each peer then transforms the audio via a modified DCT transform (MDCT), and then applies a rate-18 memory-8 TCQ. It is desired that the receiving peers recover the original audio X at 80.6 dB. Calculation shows that this can be achieved by TCQ quantizing each source with quantization step size 5.6.

Separate source coding is first compared to DSC, both with and without context coding. The results are shown in Table 6 (see FIG. 15). It can be seen from the table that the context modeling is a powerful technology in both source coding and DSC. It achieves a rate reduction of 18% in the source coding, and achieves a rate reduction of 23% in DSC. The performance of DSC without context modeling is only 2% better than the separate source coding with context modeling. However, applying context modeling in DSC, it is possible to achieve an additional saving of 23%, and allow DSC to beat separate source coding significantly.

Figure 16:
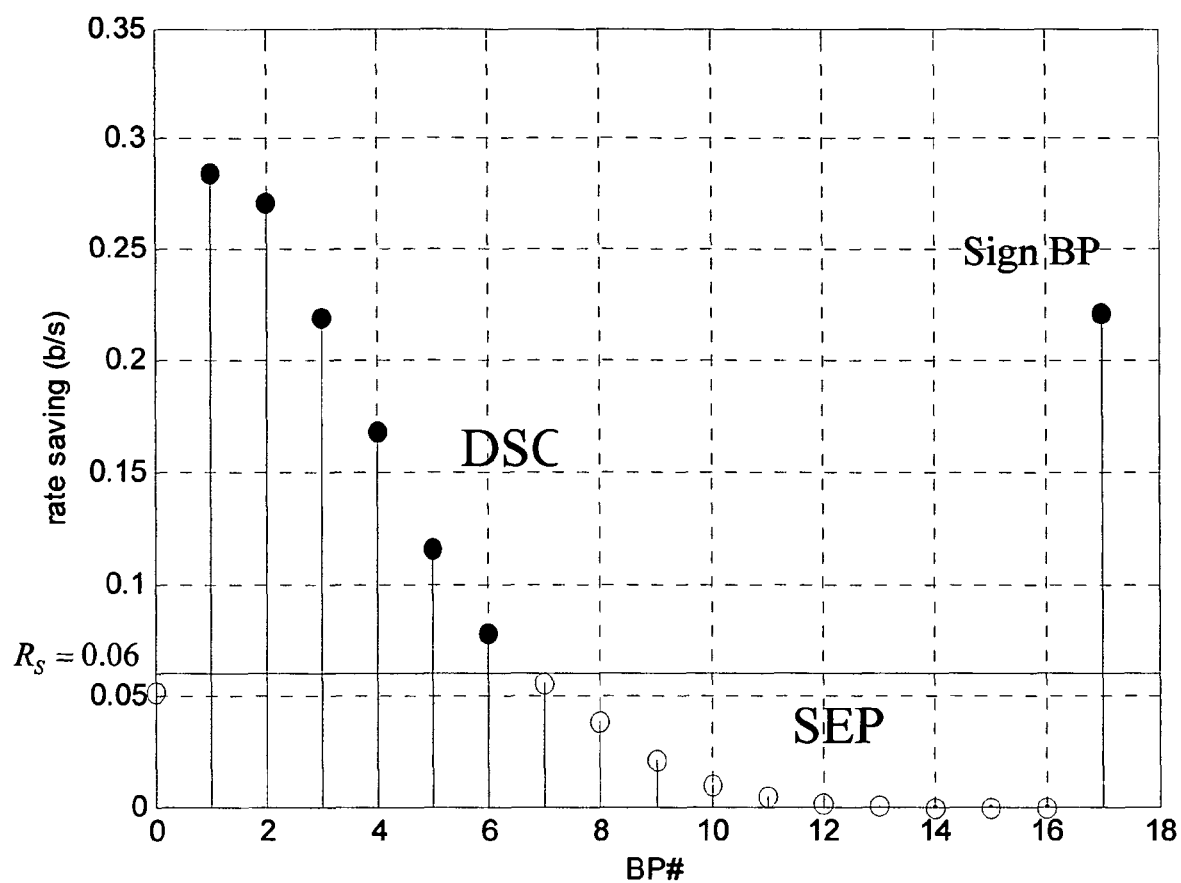
FIG. 16 is a graph illustrating the rate savings for each bitplane for DSC vs. separate source coding (both with context modeling). The horizontal axis is the bitplane index and the vertical axis is the DSC rate saving in bit per symbol (bps).

However, an entropy analysis shows that the saving of DSC is not uniform across the bitplanes. Referring to the graph in FIG. 16, the rate savings for each bitplane is shown for DSC vs. separate source coding (both with context modeling). The horizontal axis is the bitplane index and the vertical axis is the DSC rate saving in bit per symbol (bps). Note that the DSC rate saving is small in bitplanes 0 and 7-16. In one embodiment of the present context DSC process, separate source coding is used for those bitplanes where the DSC savings is too low to justify the extra processing required (e.g., below about 0.06 bps). Thus in the example case, DSC would only be applied to bitplanes 1-6 and the sign bitplane (BP# 17). This decision results in a total rate loss of 0.18 bps, which is about 3% of the coding bitrate of separate source coding. In other implementations, the particular bitplanes that would be chosen for DSC over separate source coding may differ from the example case, and can be readily estimated in the manner shown above.

Figure 17A:
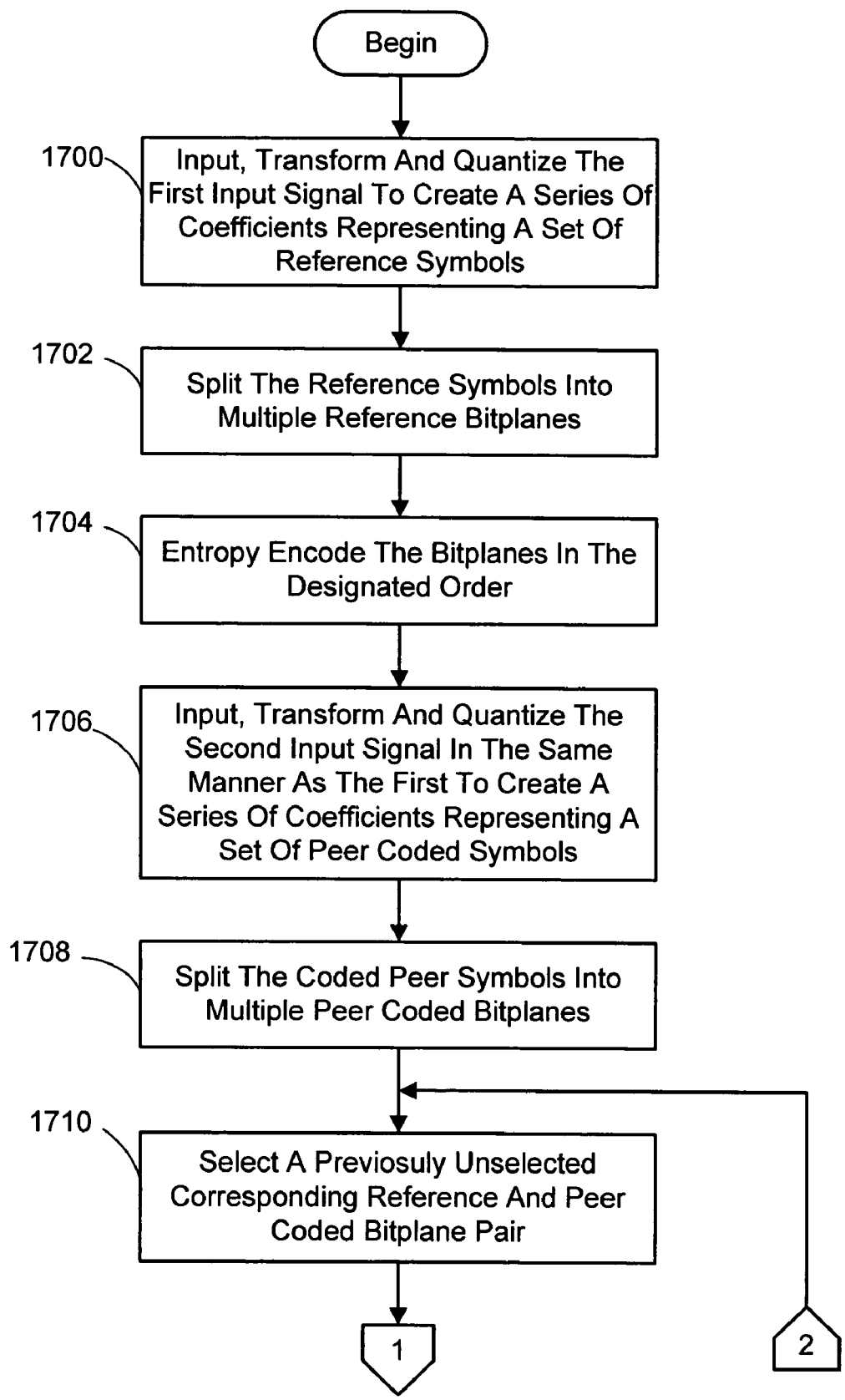

In general, this bitplane-by-bitplane process for encoding two, correlated input signals, can be accomplished as follows. Referring to FIGS. 17A-B, the process begins by inputting, transforming and quantizing a first of the input signals to create a series of coefficients representing a set of reference symbols (process action 1700). The reference symbols are then split into multiple reference bitplanes (process action 1702), and the bitplanes are entropy encoded in a designated order (process action 1704). It is noted that any order can be employed, but in tested embodiments the encoding started with the most significant bitplane and preceding in order to the least significant bitplane that it was desired to encode. The second of input signals is input, transformed and quantized in the same manner as the first to create a series of coefficients representing a set of peer coded symbols (process action 1706). The peer coded symbols are also split into multiple peer coded bitplanes (process action 1708). A previously unselected corresponding reference and peer coded bitplane pair is then selected (process action 1710). It is next ascertained if the peer coded bitplane of the selected pair is one of a group of peer bitplanes that has been pre-determined to be of a type that, if encoded using a context-based distributed source coding technique, would result in a savings in the amount of data produced in comparison to encoding the bitplane using a separate source coding technique, that exceeds a prescribed minimum savings threshold (process action 1712). If it is determined the peer coded bitplane is not in the pre-determined group, then it is entropy encoded using standard techniques (process action 1714). However, if it is determined the peer coded bitplane is in the pre-determined group, then it is encoded using the context-based DSC encoding process described previously, starting with the formation of the virtual channel from the reference bitplane and the peer coded bitplane (process action 1716), and accessing prior coded bitplanes associated with the peer coded bitplane and reference bitplane to obtain the prior coded symbols (process action 1718). The rest of the bitplane encoding procedure is as described in connection with process actions 900-910 of FIG. 9 (process action 1720). It is then determined if all the corresponding reference and peer coded bitplane pairs have been selected (process action 1722). If not, process actions 1710 through 1722 are repeated as appropriate. Otherwise the process ends.

Although the subject matter of this specification has been described in language specific to structural features and/or methodological acts, it is understood that the subject matter defined in the appended claims is not necessarily limited to the specific features or acts described above. Rather, the specific features and acts described above are disclosed as example forms of implementing the claims.

Wherefore, what is claimed is:

1. A computer-implemented process for distributed source coding of a set of to-be coded symbols with the aide of a set of reference symbols and context comprised of a set of prior coded symbols, comprising the following actions:

establishing a virtual channel between the set of to-be coded symbols and a set of reference symbols, wherein the set of to-be coded symbols will be distorted by the virtual channel into the set of reference symbols, and the virtual channel reflects the difference between the set of to-be coded symbols and the set of reference symbols;

establishing a prescribed number of context categories for the virtual channel using the set of prior coded symbols;

dividing the virtual channel into multiple sub-channels each dedicated to one of the context categories;

calculating a channel error characteristic of each sub-channel;

calculating a combined channel error rate of the virtual channel as a whole; and channel encoding the set of to-be coded symbols into syndrome or parity bits using a channel encoder which are capable of protecting against the combined channel error rate.

2. The process of claim 1, wherein the to-be coded symbols are a bitplane of to-be coded bits, and the set of reference symbols is a bitplane of reference bits.

3. The process of claim 1, wherein the process action of channel encoding comprises an action of employing one of (i) a LDPC code-based channel encoder, or (ii) a turbo code-based channel encoder.

4. The process of claim 3, wherein the LDPC code-based channel encoder is employed whenever the channel error rate equals or exceeds a prescribed error value, and wherein the turbo-based channel encoder is employed whenever the channel error rate is less than the prescribed error value.

5. The process of claim 4, wherein the prescribed error value is 0.1.

6. The process of claim 2, wherein the process action of channel encoding comprising:
generating a pseudo random binary stream;
xoring the pseudo random binary stream with the to-be coded bitplane to generate a randomly flipped to-be coded bitplane;
channel encoding the flipped to-be coded bitplane into syndrome and parity bits.

7. The process of claim 2, wherein the process action of establishing the prescribed number of context categories for the virtual channel, comprises the actions of:
establishing a first context category that a bit of the bitplane of the to-be coded bits belongs to if all the corresponding bits in each of the more significant bitplanes of the to-be coded bits are 0; and
establishing a second context category that a bit of the bitplane of the to-be coded bits belongs to if not all the corresponding bits in each of the more significant bitplanes of the to-be coded bits are 0.

8. A computer-readable medium having computer-executable instructions for performing the process actions recited in claim 1.

9. A computer-implemented process for distributed source decoding of a set of channel encoded coded symbols with the aide of a set of reference symbols and a set of prior coded symbols, using syndrome and priority bits generated by a channel encoder that protects from channel error in a virtual channel, and wherein the virtual channel has been divided into context-based sub-channels, comprising the following process actions:
inputting the set of reference symbols;
inputting the set of prior coded symbols;
establishing context categories for the virtual channel based on the context categories used to divide the virtual channel into sub-channels;
dividing the virtual channel into multiple sub-channels each dedicated to one of the context categories;
calculating a channel error characteristic of each sub-channel;
computing a log likelihood of each coded symbol using the reference symbols and the corresponding virtual sub-channel error characteristic; and
decoding the coded symbols using a channel decoder to remove the errors of the virtual channel.

10. The process of claim 9, wherein the coded symbols represent a coded bitplane of coded bits, and the set of reference symbols is a bitplane of reference bits.

11. The process of claim 10, wherein the channel encoded set of coded symbols was encoded using a technique comprising,
generating a pseudo random binary stream;
xoring the pseudo random binary stream with the bitplane of coded bits prior to encoding to generate a randomly flipped coded bitplane;
channel encoding the randomly flipped coded bitplane into syndrome and parity bits, and wherein
the process action of decoding the coded symbols using a channel decoder, comprises the actions of:
generating the same pseudo random binary stream used by the channel encoder;
xoring the pseudo random binary stream with the reference bitplane to generate a randomly flipped reference bitplane;
computing a log likelihood of each coded symbol of the randomly flipped coded bitplane using the reference symbols of the randomly flipped reference bitplane and the corresponding virtual sub-channel error characteristic;
decoding the coded symbols of the randomly flipped coded bitplane using a channel decoder; and
xoring the pseudo random binary stream with the randomly flipped coded bitplane to recover the symbols thereof.

12. The process of claim 10, wherein the process action of establishing context categories for the virtual channel, comprises the actions of:
establishing a first context category that a bit of the bitplane of coded bits belongs to if all the corresponding bits in each of the more significant bitplanes of coded bits are 0, and all the corresponding bits in each of the more significant bitplanes associated with the corresponding bitplanes of reference bits are 0;
establishing a second coefficient bitplane context category that a bit of the bitplane of coded bits belongs to if all the corresponding bits in each of the more significant bitplanes of coded bits are 0, but not all the corresponding bits in each of the more significant bitplanes associated with the corresponding bitplanes of reference bits are 0;
establishing a third coefficient bitplane context category that a bit of the bitplane of coded bits belongs to if not all the corresponding bits in each of the more significant bitplanes of coded bits are 0, but all the corresponding bits in each of the more significant bitplanes associated with the corresponding bitplanes of reference bits are 0; and
establishing a fourth coefficient bitplane context category that a bit of the bitplane of coded bits belongs to if not all the corresponding bits in each of the more significant bitplanes of coded bits are 0, and not all the corresponding bits in each of the more significant bitplanes associated with the corresponding bitplanes of reference bits are 0.

13. The process of claim 10, wherein the process action of establishing context categories for the virtual channel, comprises the actions of:
establishing a first coefficient bitplane context category that a bit of the bitplane of coded bits belongs to if the values of all the corresponding bits in each of the more significant bitplanes of coded bits match the values of all the corresponding bits in each of the more significant bitplanes associated with the corresponding bitplanes of reference bits;
establishing a second coefficient bitplane context category that a bit of the bitplane of coded bits belongs to if the values of one of the corresponding bits in the more significant bitplanes of coded bits does not match the value of the corresponding bits of the more significant bitplanes associated with the corresponding bitplanes of reference bits, and the values of all bits of the more significant bitplanes of coded bits are all 0; and establishing a third coefficient bitplane context category that a bit of the bitplane of coded bits belongs to if the values of one of the corresponding bits in the more significant bitplanes of coded bits does not match the value of the corresponding bits of the more significant bitplanes associated with the corresponding bitplanes of reference bits, and one of the bit of the more significant bitplanes of coded bits is not zero.

14. The process of claim 10, wherein the coded symbols represent a sign bitplane of coded bits, and wherein the process action of establishing context categories for the virtual channel, comprises the actions of:

establishing a first sign context category that a bit of the bitplane of coded bits belongs to if not all the corresponding bits in each of the more significant bitplanes of coded bits are 0, but all the corresponding bits in each of the more significant bitplanes associated with the corresponding bitplanes of reference bits are 0; and establishing a second sign context category that a bit of the bitplane of coded bits belongs to if not all the corresponding bits in each of the more significant bitplanes of coded bits are 0, and not all the corresponding bits in each of the more significant bitplanes associated with the corresponding bitplanes of reference bits are 0.

15. A computer-readable medium having computer-executable instructions for performing the process actions recited in claim 9.

* * * * *